United States Patent [19]
Palino et al.

[11] Patent Number: 4,972,253
[45] Date of Patent: Nov. 20, 1990

[54] PROGRAMMABLE CERAMIC HIGH PERFORMANCE CUSTOM PACKAGE

[75] Inventors: Douglas F. Palino, Marlboro; Amnon Fisher, Newton, both of Mass.

[73] Assignee: Digital Equipment Corporation, Maynard, Mass.

[21] Appl. No.: 211,984

[22] Filed: Jun. 27, 1988

[51] Int. Cl.⁵ .............................................. H01L 23/02
[52] U.S. Cl. ....................................... 357/74; 357/71; 357/70
[58] Field of Search ................... 357/45, 74, 70, 81, 357/71

[56] References Cited

U.S. PATENT DOCUMENTS

| | | | |
|---|---|---|---|
| 4,338,621 | 7/1982 | Braun | 357/74 |
| 4,407,007 | 9/1983 | Desai et al. | 357/74 |
| 4,458,297 | 7/1984 | Stopper et al. | 361/403 |
| 4,513,355 | 4/1985 | Schroeder et al. | 361/403 |
| 4,551,747 | 11/1985 | Gilbert et al. | 357/74 |
| 4,811,082 | 3/1989 | Jacobs et al. | 357/80 |
| 4,879,588 | 11/1989 | Ohtsuka et al. | 357/68 |

FOREIGN PATENT DOCUMENTS

87/02827 5/1987 PCT Int'l Appl. ................... 357/45

OTHER PUBLICATIONS

Hoss et al., "Unique Design of Pin Grid Array Package Accommodates Multiple VLSI Chip Sources," Abstract, National Bureau of Standards IEEE-CHMT Society, VLSI & GAAS Packaging Workshop, Sheraton Imperial Hotel, Research Triangle Park, N.C., Sep. 14-16, 1987.

*Primary Examiner*—Andrew J. James
*Assistant Examiner*—Donald L. Monin
*Attorney, Agent, or Firm*—Arnold, White & Durkee

[57] ABSTRACT

Ceramic packages for encapsulating integrated circuit (IC) chips are made of layers which are laminated together in a co-firing process. A signal layer includes leads electrically connecting external pins with the chip itself. Other layers supply ground and power to the chip by way of the signal layer. The layers are designed so that when a new chip is to be introduced, only one layer of the package, called a "VIA layer," needs to be redesigned for the new chip. The VIA layer is programmed with connections or "vias" at specific locations between the signal layer and a power or ground layer above or below the signal layer. The "vias" are conductive dots that extend through the VIA layer. The layer opposite the signal layer on the other side of the VIA layer contains "internal supply and ground bars" that are electrically connected to internal supply and ground layers. Therefore, selective positioning of the vias enables each signal lead in the signal layer to be selectively connected to internal power or ground. The internal supply and ground bars are aligned transversely with respect to the signal lead, and are close to the chip to minimize the inductance of the connections. For custom chip designs, the programmed VIA layer enables certain bonding areas to be preassigned to power and ground while permitting the circuit designer to freely select the assignment of the external pins.

11 Claims, 8 Drawing Sheets

PROGRAMMABLE CERAMIC HIGH PERFORMANCE CUSTOM PACKAGE

BACKGROUND OF THE INVENTION

1. Field of the Invention

This invention relates generally to electronic circuits and more particularly to the design of ceramic packages which encapsulate integrated circuits.

2. Description of Related Art

Electronic circuits for complex systems such as digital computers typically are comprised of a multiplicity of interconnected integrated circuit chips. The integrated circuit chips are made from a semiconductor material such as silicon or gallium arsenide, and microscopic circuits are formed on the top surface of the chips by photolithographic techniques. In a conventional form of construction, the integrated circuit chips are mounted in respective ceramic packages, and the ceramic packages are mounted on a printed wiring board. The ceramic packages have numerous external pins which are mechanically attached by solder or socket to conductor patterns printed on the printed wiring board.

Each ceramic package has a central cavity receiving an integrated circuit chip, and a set of conductors called leads connecting the external pins to the integrated circuit chip. Typically the leads are provided by a thick film conductor pattern deposited on a ceramic layer of the package. The conductor pattern includes a number of bonding areas spaced around the central cavity of the package. When an integrated circuit is received in the central cavity, the bonding areas align with respective bonding pads formed in metalization layers on the surface of the integrated circuit chip. The bonding areas of the package are connected to the bonding pads on the chip by thin flexible segments of bonding wire or metal tape that are bonded by thermocompression to the bonding areas and pads.

In Very Large Scale Integrated (VLSI) circuits, it is desirable to provide multiple power and ground connections between the external pins and the bonding pads on the integrated circuit. Internal power and ground connections supply power to all of the circuits on the chip with the exception of the input/output stages connected directly to the bonding pads; the input/output stages are supplied with power from external power and ground connections. In order to avoid the need to make a multiplicity of power and ground connections on the printed wiring board, connections are typically provided by separate layers of conductor patterns formed in the package. In either case the arrangement of the conductors from the external pins to the bonding pads affects the inductance and capacitance of the connections, and the isolation between the various connections.

The placement of signal, power, and ground pads on the integrated circuit is to a great extent dictated by the functions performed by the integrated circuit. Therefore, for any given integrated circuit design, there is a preferred arrangement of the conductor patterns between the external pins and the bonding pads. It would be desirable to design electrical components so that certain pins perform the same functions from component to component. However, the complexity inherent in integrated circuit chip design prevents the designer from assigning corresponding chip pads on different chips to perform the same functions.

For newly designed VLSI circuits having multiple power and ground connections, it has been necessary to design multiple layers of conductor patterns interconnecting the external pins to the integrated circuit chip. Associated with this design effort is the necessity of fabricating multiple masks for defining the newly designed conductor layers.

SUMMARY OF THE INVENTION

For designing a package for a custom VLSI chip, the present invention makes it necessary to only re-design a single layer, referred to as the "VIA layer." The VIA layer provides selected or "programmed" connections at specific locations between a signal layer and a power or ground layer above or below the signal layer. The connections at the specific locations are made by conductive dots or "vias" that extend through the VIA layer. The layer opposite the signal layer on the other side of the VIA layer contains "internal supply and ground bars" that are electrically connected to other power or ground layers. Therefore, selective positioning of the vias enables each signal conductor in the signal layer to be selectively connected to internal or external power or ground.

In a preferred embodiment, the chip package consists of five conductive layers. A first layer near the top of the chip CAVITY connected to external ground. A second layer includes the signal connections or traces from the integrated circuit to the external pins. A third layer is connected to external power. A fourth layer is connected to internal ground. A fifth layer is connected to internal power. The second and layer is a standard design and need not be changed. The third layer contains pairs of internal supply and ground bars which are electrically connected to the fourth or fifth layers. The programmed VIA layer is placed between the second and third conductive layers to make a selective connection from any signal connection or trace on the second layer to external SUPPLY or any one of the internal supply bars on the third layer. Therefore, any signal connection can be connected to any of the third, fourth or fifth layers through the programmed VIA layer.

To design a package for a new integrated circuit chip, the designer selects an appropriate set of standardized masks for the first and second layers, and then the VIA layer is programmed. The standardized masks include, for example, a first set where only the corner outer lead bonding areas are preassigned to power and ground, and a second set where a larger number of outer lead bonding areas are preassigned to power and ground.

BRIEF DESCRIPTION OF THE DRAWINGS

Other objects and advantages of the invention will become apparent upon reading the following detailed description and upon reference to the drawings in which.

Figure 1:
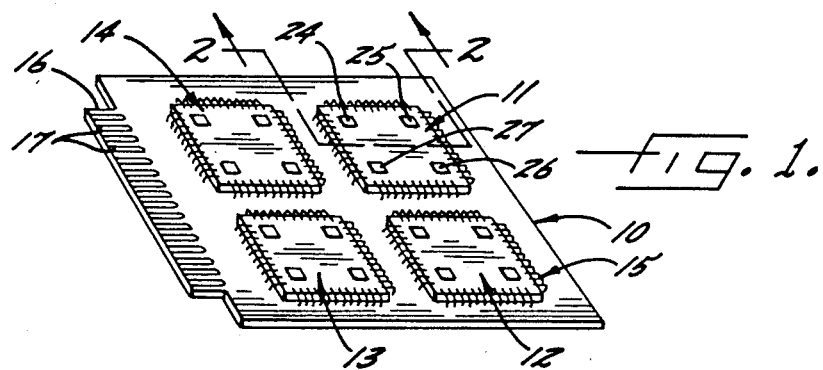
FIG. 1 shows a perspective view of a printed wiring board, upon which are mounted ceramic integrated circuit packages according to the present invention.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DESCRIPTION OF THE PREFERRED EMBODIMENTS

1. Detailed Description of the Figures

Turning now to FIG. 1, there is shown a printed wiring board 10 interconnecting four integrated circuit packages 11, 12, 13 and 14. Each package is electrically and mechanically connected to the printed wiring board by pins or leads 15 which extend or depend from the outer periphery of the package. The printed wiring board is constructed of laminated layers of epoxy-fiberglass upon which copper traces (not shown) are defined using a photolithographic process. The copper traces provide electrical connections between selected pins of the chip packages. To enable the printed wiring board to be installed in a system (not shown), the printed wiring board has an edge portion 16 formed with a multiplicity of contact fingers 17. The contact fingers 17 are connected to some of the copper traces (not shown) and are defined to mate with an edge connector (not shown) which connects the board 10 into the system (not shown).

Figure 2:
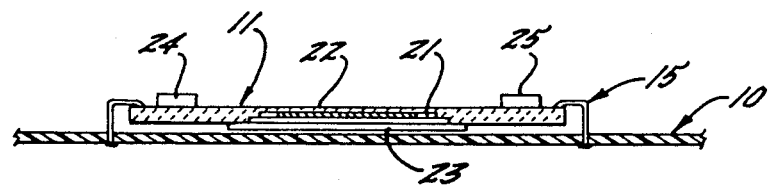
FIG. 2 is a cross-section along line 1—1 in FIG. 1 showing "cavity-down" mounting of a package on the printed wiring board.

Turning now to FIG. 2, there is shown a cross-section of the package 11 mounted on the board 10. The package 11 has an internal cavity 21 receiving an integrated circuit chip 22. The cavity 21 is closed by a cover 23 facing the board 10. This mounting arrangement, with the cover 23 facing the printed wiring board 10, is known as a "cavity down" arrangement. The present invention, however, is also applicable to packages designed for "cavity up" mounting. Whether "cavity down" or "cavity up" is preferred is dependent upon the desired construction of the pins 15 and the cooling or heat-sinking requirements for the integrated circuit chip 22.

Figure 2A:
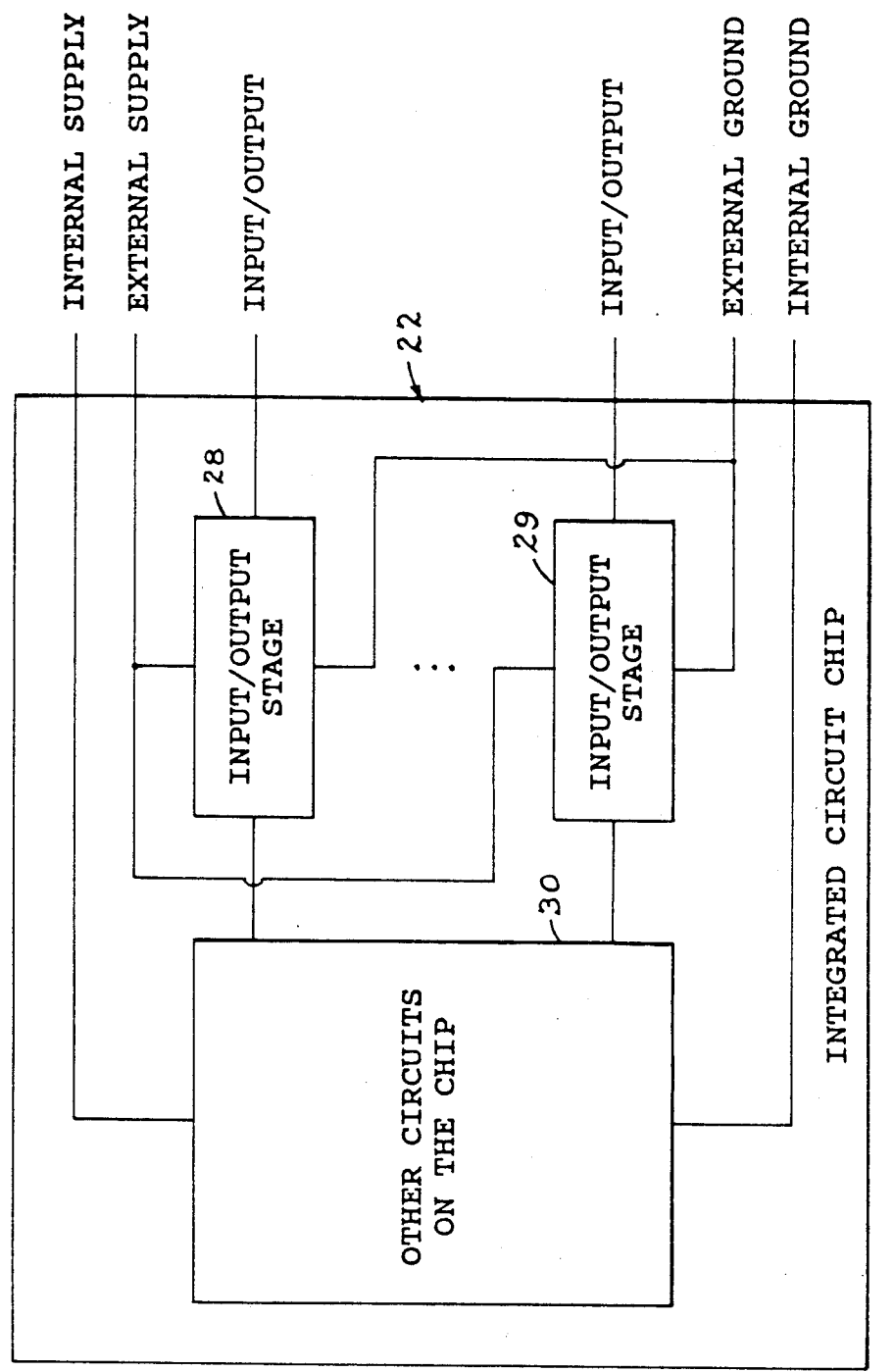
FIG. 2A is a schematic diagram of an integrated circuit chip having input/output stages using external ground and supply, and other circuits on the chip using internal ground and supply.

On the side of the package 11 opposite the cavity 21 here are mounted a number of ceramic chip capacitors 24, 25. Preferably there are four such capacitors mounted near the four corners of the package, as shown in FIG. 1. The capacitors 24 and 26 are connected between external ground and external supply, and the capacitors 25 and 27 are connected between internal ground and internal supply. As introduced above and as shown in FIG. 2A, the input/output stages 28, 29 of the integrated circuit chip 22 use the external ground and external supply, and the other circuits 30 on the chip use internal ground and internal supply. Dual grounds and supplies are used to decouple noise from the output drivers of the input/output stages and also to permit the internal circuits to use a supply voltage that is different from that of the external circuits.

Figure 3:
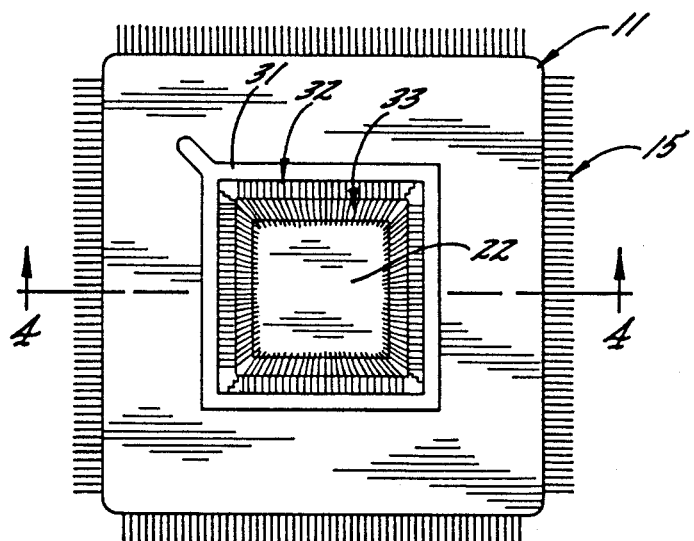
FIG. 3 is a bottom view of the package shown in FIG. 2 with the cover of the package removed so as to expose the integrated circuit chip inside the package.

Turning now to FIG. 3, there is shown a view of the integrated circuit package 11 with the cover 23 removed and looking into the central cavity. The cover attaches to the package 11 via a thick film metal seal ring 31 which is connected to external ground. The package 11 has 56 pins on each side for a total of 224 pins. The pins 15 are connected by signal leads (shown in FIG. 5 and described further below) to "outside lead bond" (OLB) areas 32 spaced around the central cavity of the package 11. The OLB areas are connected by bonding wires 33 to respective bonding pads on the integrated circuit chips 32. The bonding pads are 100 micron square metalization areas near the chip's edges. The bonding wires 33 are connected to the OLB's and the bonding pads by thermocompression bonding.

Figure 4:
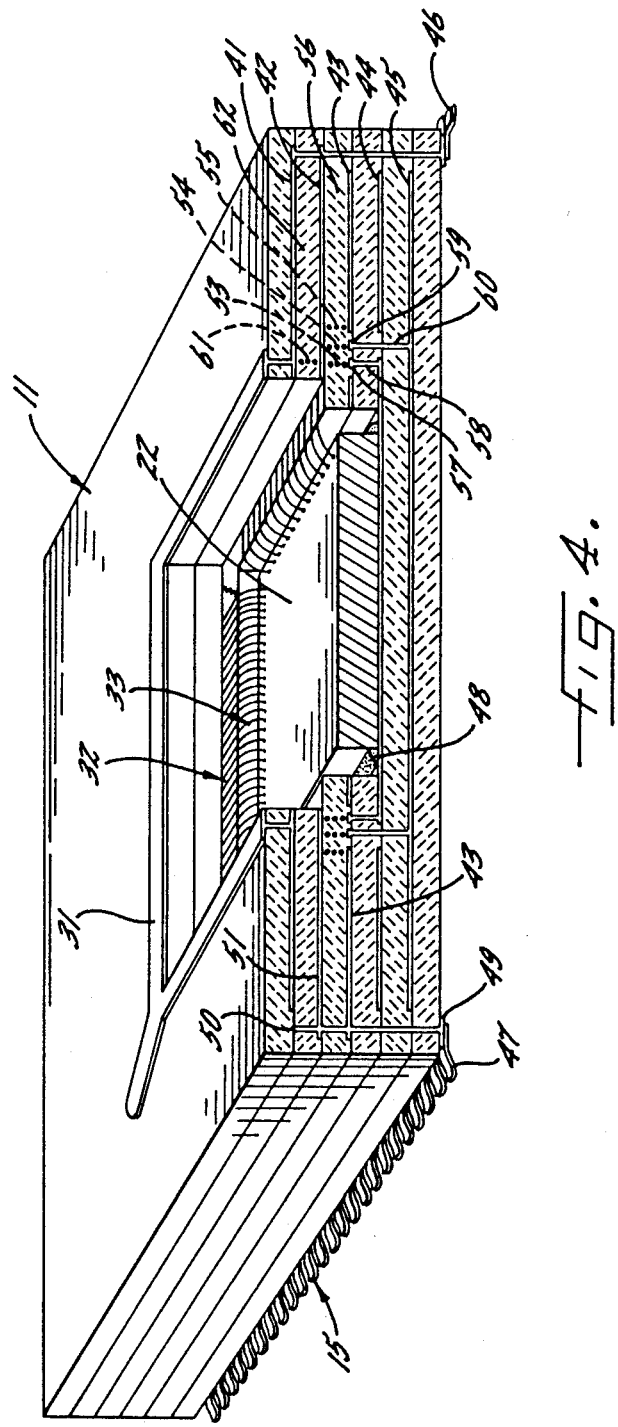
FIG. 4 is a detailed cross-section along line 4—4 in FIG. 3 showing layered construction of the ceramic integrated circuit package and internal connections and vias between a conductive layer for conveying signals and conductive layers for external and internal power and ground.

Referring now to FIG. 4, there is shown a cross-section of the package 11 and the chip 22. The thickness of the package and the chip has been exaggerated in FIG. 4 in order to illustrate the internal structure of the package. Preferably the package is about 38.5 mm by 38.5 mm square and has a thickness of about 1.8 mm.

The package 11 is made of alternate conducting and nonconducting layers, formed of thick conductive film and nonconductive ceramic, respectively. Considering first the conducting layers 41–45 beginning from the cavity side of the package, layer 41 is an external ground plane which is directly connected to certain external pins such as the pin 46. Layer 42 is a signal layer including the leads (shown in FIG. 5) which directly connect the pins 15 to respective outer lead bond areas 32. Layer 43 is an external power (VDD) plane which is directly connected to certain external pins such as the pin 47. Layer 44 is an internal ground plane to which the substrate of the chip 22 is connected by conductive epoxy 48. The last layer 45 is an internal power (VDD) plane.

In addition to the conductive layers 41–46 which provide horizontal connections, the package 11 includes vertical connections called "vias" which extend through the ceramic layers separating the conductive layers 41 to 45. Each of the external pins 15, for example, is connected by a via to its respective lead on the signal layer 42. In particular, the pin 47 is bonded to an external pad 49 aligned with and connected to a via 50 that extends vertically to the level of the external ground layer. The via 50 connects the pin 47 to its respective trace 51 in the signal layer. In addition, since the pin 47 has been preassigned to function as an external supply pin, the via 50 also intersects the external supply layer 43.

The vias extending vertically from the external pins 15 extend all the way to the level of the external ground plane so that each pin could be preassigned either to external ground, external supply, internal ground, or internal supply, by extending a portion of the respective conductive layer so that the respective via intersects the extended portion of the respective conductive layer. The extended portions 51 for the external ground plane, for example, are more precisely shown in FIG. 7.

A certain number of outer lead bond areas 32 are required for supplying external power and ground to output drivers on the chip 22. One output driver is required for each output signal or pin and each input/output signal or pin, but an output driver is not required for an input only signal or pin. Typically one external power and ground pair is required for every eight output drivers. Internal ground and supply pairs are also required, but the precise number is dependent on the power requirement of the internal circuitry. Since it is desirable to use as many of the pins as possible for input and outputs, only a minimum number of OLBs should be preassigned for supplying power and ground.

For enabling the package 11 to accommodate a variety of chip designs, it has been necessary to modify a plurality of the conductive layers 41, 43, 44 and 45 in order to assign a different set of pins to the external and internal grounds and supplies. The modifications have required changes in the masks which are used during the fabrication of the conductive layers. Mask changes, however, are relatively expensive.

To minimize the changes needed in the masks for the external ground and supply layers 41, 43, a first standardized set of external ground and supply layer masks are used to provide a number of preassigned external supply and ground pins for chips using primarily "standard cell" integrated circuit designs. For chips using primarily custom integrated circuit designs, however, it is undesirable to require certain pins to be preassigned to external power and ground, since the circuit designer would like the option of freely selecting the location of all of the signals and supply connections to the chip. In either case it is economically unfeasible to make a sufficient number of standardized internal supply and ground layer masks that would provide efficient pin allocation in most cases.

In accordance with an important aspect of the present invention, the need for modifying the masks for the conductive layers 41–45 is eliminated by programming vias 53, 54, 55 in the ceramic layer 56 between the signal layer 42 and the external supply layer 43. By programming the "VIA layer" 56, only a single layer of the chip package Il need be redesigned for most new integrated circuit designs, and in addition the inductance of the internal supply and ground connections is minimized.

As shown in FIG. 4, the programmed vias 53 extend from selected signal traces to internal ground bus bars 57 which are transverse to the signal leads and disposed at the level of the external supply layer 43. The internal ground bus bars 57 are connected by vias 58 to the internal ground layer 44. In a similar fashion programmed vias 54 extend from other selected signal leads to internal supply bus bars 59 which are also transverse to the signal leads and disposed at the level of the external supply layer. The internal supply bus bars 58 are connected by vias 60 to the internal supply layer 45. The programmable "VIA layer" 56 can also be programmed with vias 55 between selected leads in the signal layer 42 and the external supply layer, although in these cases it is necessary to provide additional external ground connections, which are preferably made by forming vias 61 in the ceramic layer 62 between the signal layer 42 and the external ground layer 41. Alternatively, external ground bus bars could be formed at the level of the external supply layer 43 to permit external ground connections to be programmed in the programmable VIA layer 56.

Figure 5:
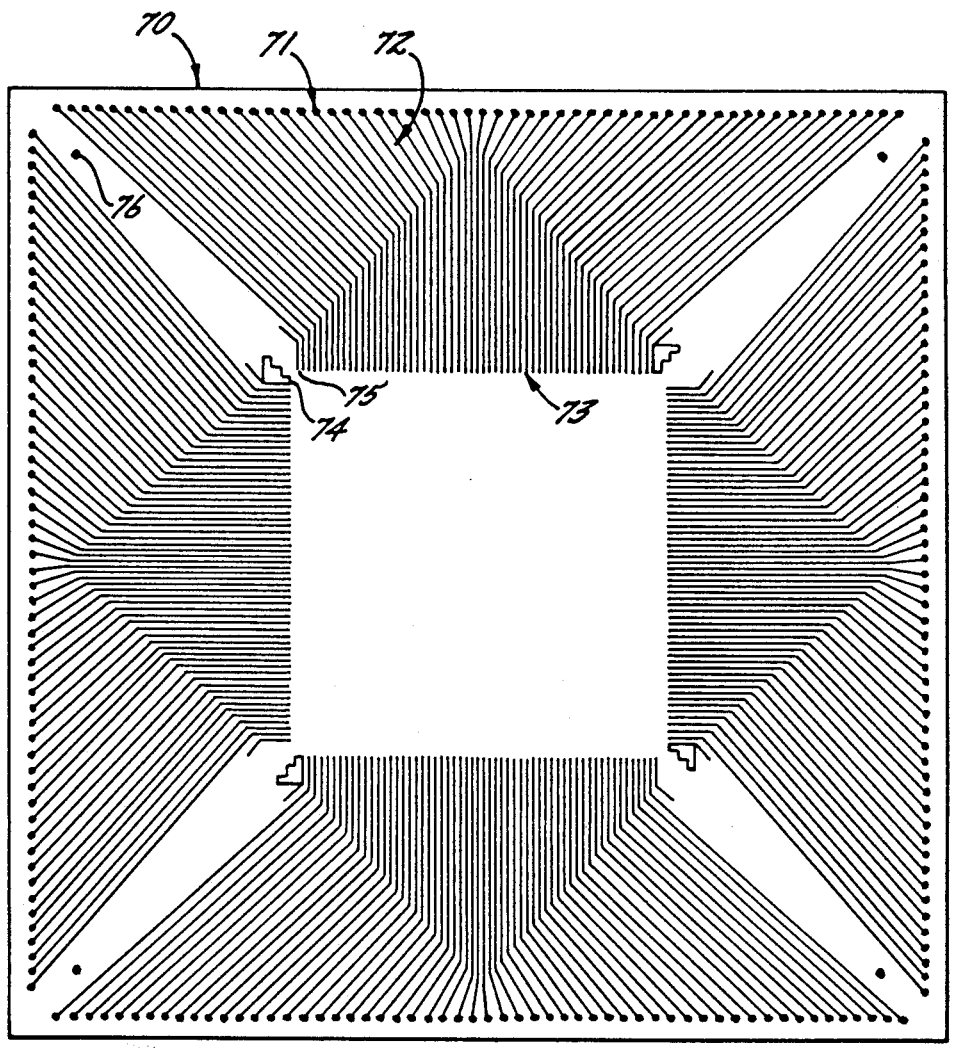
FIG. 5 is a mask defining the connections or traces in the signal layer from external pins to "outside lead bond" (OLB) areas.

Turning now to FIG. 5, there is shown the "standard cell" mask generally designated 70 for defining the signal layer (42 in FIG. 4). The mask includes dots 71 for defining portions of the vias 50 leading to the external pins 15, and patterns 72 which define the signal leads 51. The patterns 72 terminate with end portions 73 which define the outer lead bonding areas 32. As should be evident from FIG. 5, the mask 71 provides a pattern 72 to define a signal trace from each pin to a respective outer lead bonding area. In addition, the mask 70 includes a respective pair of patterns 74 and 75 for defining respective outer lead bonding areas for external ground and external supply at the corners of the central cavity in the package. Any additional outer lead bonding areas for the external supply pads are providing by programming the via layer to connect selected signal leads to the external supply layer (43 in FIG. 4). The mask 70 for the signal layer in addition includes dots 76 near the outer corners which define portions of vias that connect the external or internal ground layers (41, 44 in FIG. 4) to the chip capacitors (24 to 27 in FIG. 1).

Figure 6:
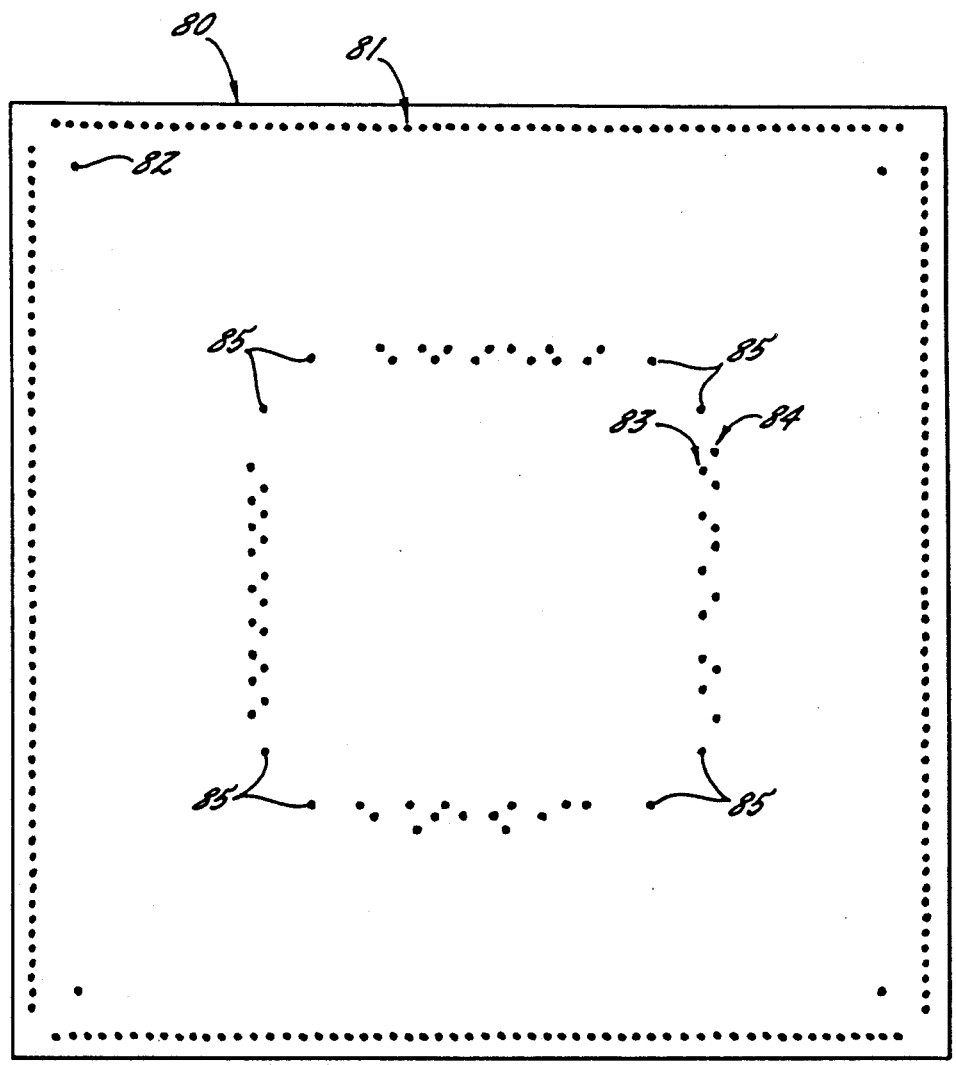
FIG. 6 is a mask defining the connections in a programmed VIA layer which is disposed between the signal layer of FIG. 5 and the external VDD layer of FIG. 7.

Turning now to FIG. 6 there is shown a mask generally designated 80 which defines the vias layer. The dots in the mask define conductive areas and otherwise the mask 80 defines nonconductive ceramic in the VIA layer (56 in FIG. 4). In particular, the mask 80 includes dots generally designated 81 which define portions of the vias (50 in FIG. 4) leading to the external pins (15 in FIG. 4). The mask 80 also includes dots 82 near the external corners to define portions of vias which connect the external or internal ground layers (41, 44 in FIG. 4) to the chip capacitors (24 to 27 in FIG. 1). More importantly, the mask 80 has respective rows of dots 83 and 84 for defining the programmable vias (53, 54 in FIG. 4) connecting selected signal leads to the internal ground bars 57 or the internal supply bars 59. The mask 80 also has dots 85 for defining vias (55 in FIG. 4) connecting lead bonding areas or leads to the external supply layer 43, respectively.

Figure 7:
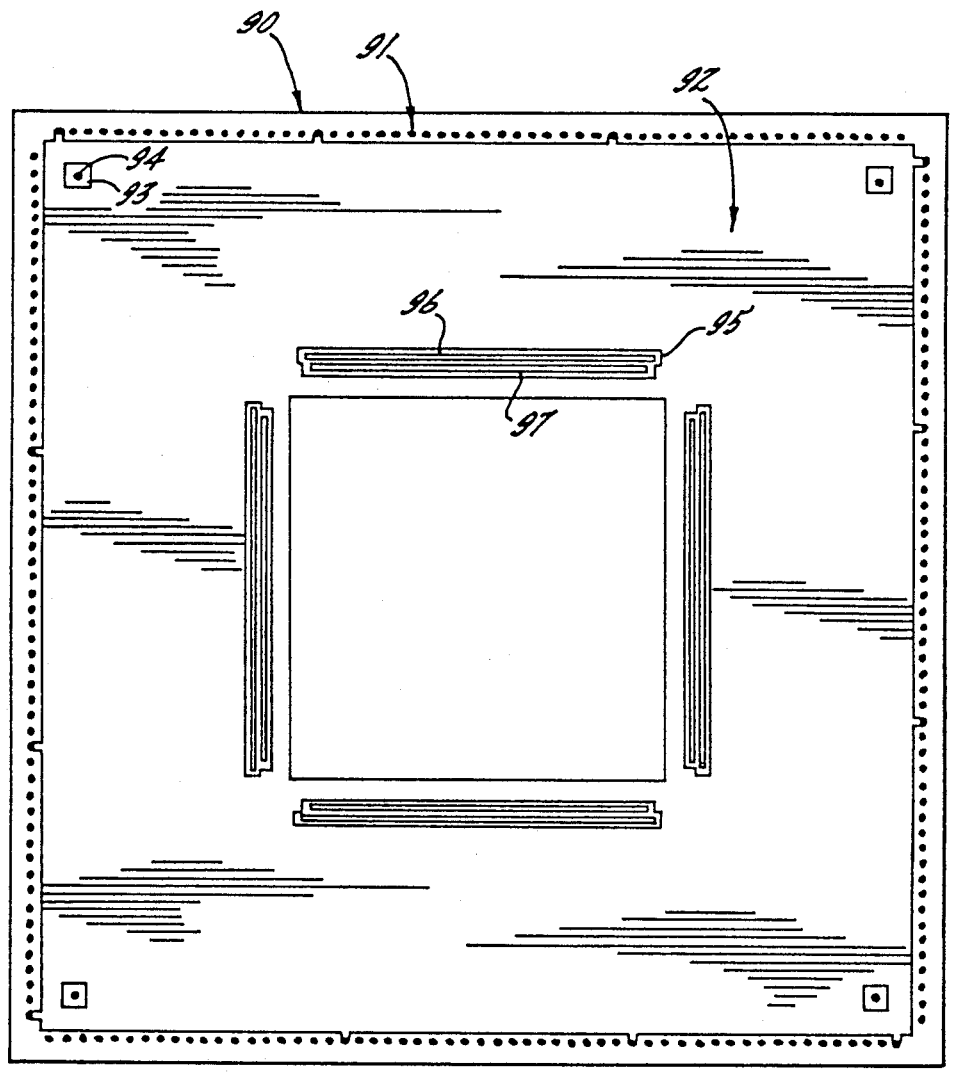
FIG. 7 is a mask defining the connections in an external power supply (VDD) layer including internal supply and ground bars.

Turning now to FIG. 7, there is shown the "standard cell" mask generally designated 90 which defines the external supply layer (43 in FIG. 4). The mask 90 includes dots 91 for defining portions of the vias (50 in FIG. 4) connected to the external pins (15 in FIG. 4). The external supply layer 43 is defined by a planar portion 92 of the mask 90. The mask 92 includes apertures 93 in which dots 94 are centered for defining the vias connecting the external or internal ground planes (41, 44 in FIG. 4) to the chip capacitors (24–27 in FIG. 1). More importantly, the planar portion 92 includes apertures 95 into which are placed elongated areas 96 and 97 for defining the internal ground bars 57 and the internal supply bars 59, respectively.

Figure 8:
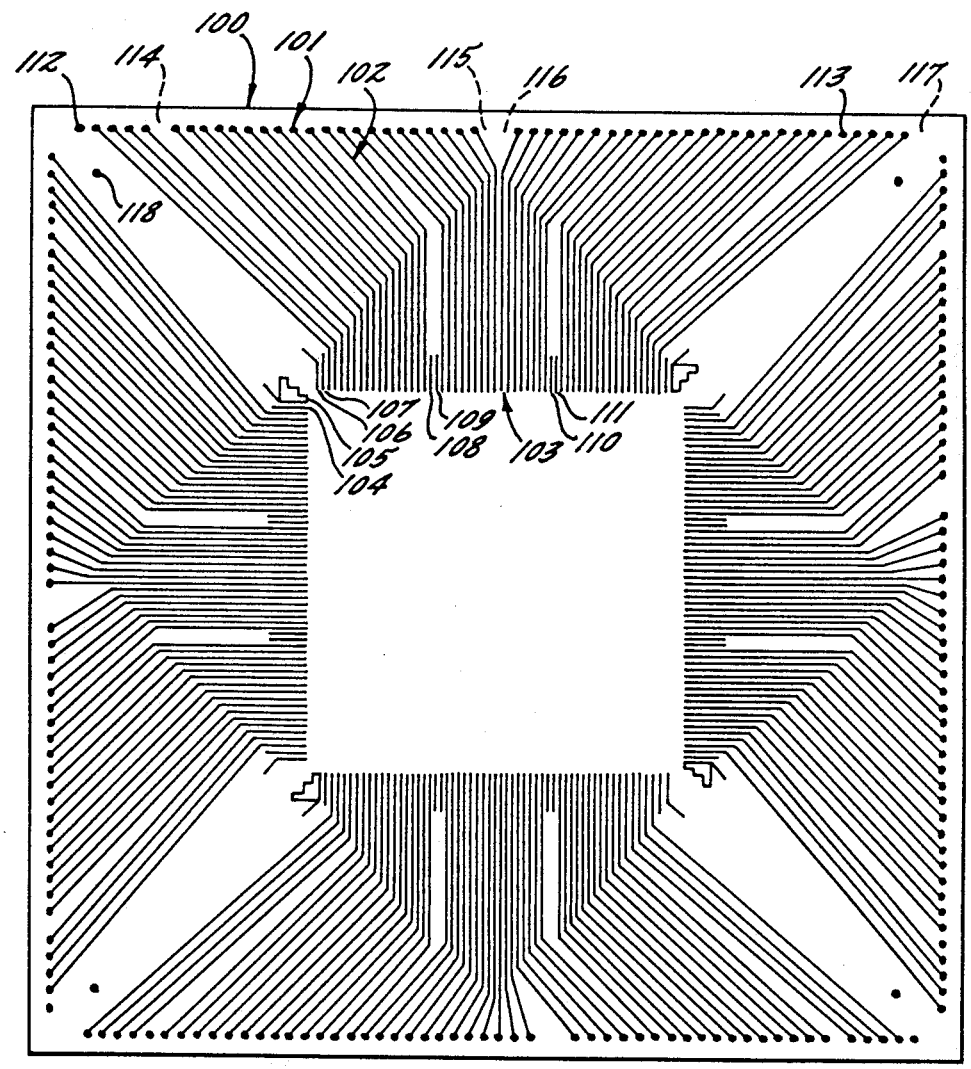
FIG. 8 is an alternative arrangement for the mask defining the signal leads in which the outside lead bond areas do not directly correspond to the external pins.

Turning now to FIG. 8, there is shown a "custom design" mask for defining the signal layer (42 in FIG. 4). The mask 100 includes dots 101 defining portions of the vias (50 in FIG. 4) leading to the external pins (15 in FIG. 4), but all of these vias do not extend up to the external ground plane (41 in FIG. 4). The mask 100 includes two hundred elongated areas 102 for defining signal leads from two hundred of the pins to terminal portions 103 defining outer lead bond areas. However, there are thirty-two patterns which are used to define outer lead bonding areas which are not connected by signal leads to the external pins, and instead are connected by vias 61 to the external ground layer 41, or vias 55 to the external supply layer 43 (see FIG. 4) to define external supply and ground pairs. These outer lead bonding areas for external ground and supply are defined by four patterns 104, 105, 106 and 107 at each corner, and two pairs of outer lead bonding areas which are spaced between each pair of neighboring corners and are defined by patterns 108, 109 and 110, 111.

The mask 100 in FIG. 8 includes some dots 101 which define portions of the vias (50 in FIG. 4) leading to the external pins (15 in FIG. 4) but which are not connected by leads to the outer lead bonding areas (32 in FIG. 4). There are a total of eight such dots, including two on each side, such as the dots 112 and 113. These dots define portions of the vias connecting the external ground plane (41 in FIG. 4) to the external pins (15 in FIG. 4). On each side of the mask 101 there are also positions such as the positions 114, 115, 116 and 117 where dots are missing from the positions of the vias (50 in FIG. 4) leading to the external pins (15 in FIG. 4). The positions 114 and 117 correspond to vias connecting external pins to the external supply layer (43 in FIG. 4), and the vias at the positions 115 and 116 connect the internal supply and internal ground to external pins. The mask 100 also has dots 118 near the outer corners defining vias connecting the external or internal ground layers (41, 44 in FIG. 4) to the chip capacitors (24 to 27 in FIG. 1).

The standardized mask 100 defining the signal leads in the custom design mask set imposes a limited set of constraints on the ability of the chip designer to select the assignments of the outer lead bonding areas. The chip designer has a free hand in selecting the location of all the signals and the internal supply connections to the integrated circuit chip. However, the chip designer is required to work with a fixed number of outer lead bonding areas which are preassigned to external supply and ground and their corresponding pin locations. Since these outer lead bonding areas for the external supply and ground are connected by the vias 61 or 53 to the external ground or supply plates 41, 43 (see FIG. 4), the inductance of the external power and ground connections is much lower than it would be if the connections were provided by signal leads.

Figure 9:
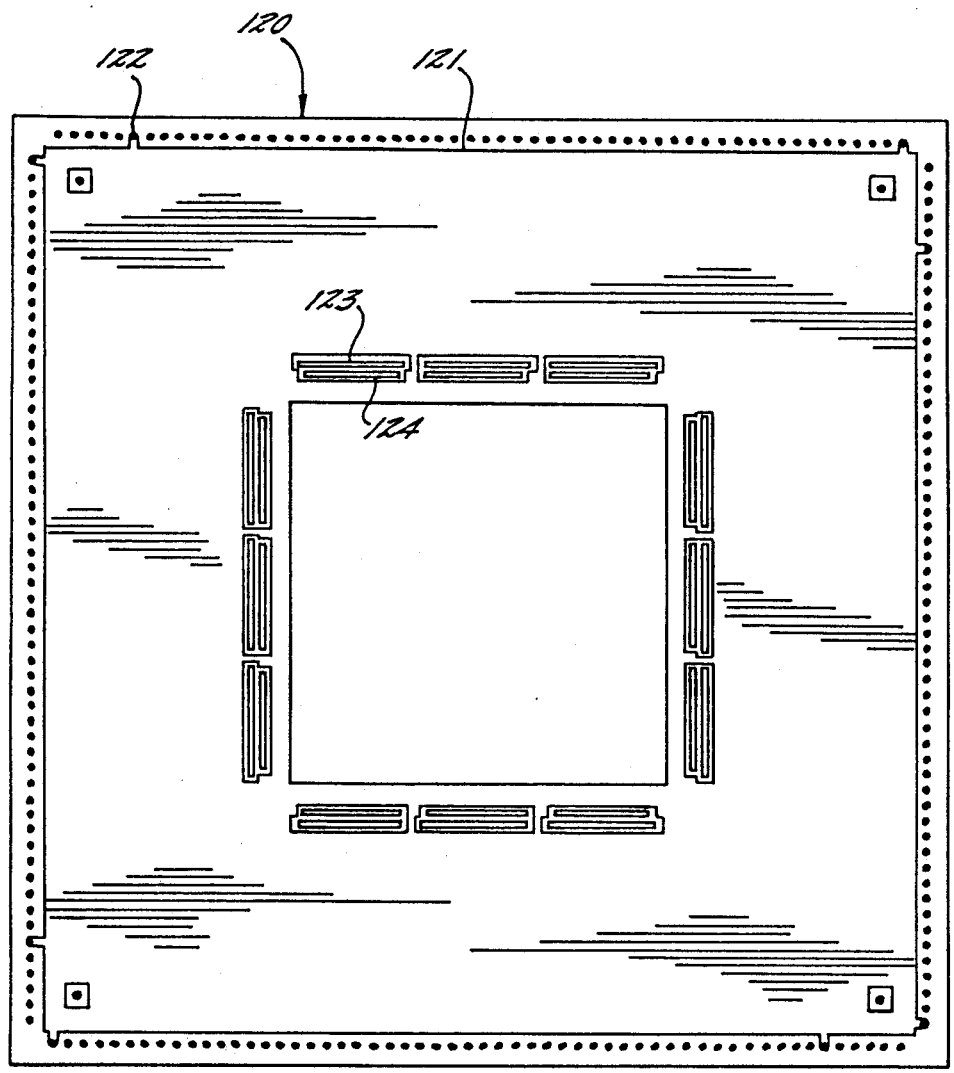
FIG. 9 is an alternative arrangement for the mask defining the connections and the internal supply and ground bars in the external power supply (VDD) layer.

Turning now to FIG. 9, there is shown the custom design mask generally designated 120 for defining the external supply layer (43 in FIG. 4). The mask 120 in FIG. 9 is similar to the mask 90 in FIG. 7, except for the fact that the mask 120 includes a planar area 121 having protrusions 122 defining connections to a different set of pins assigned to external supply, and the mask 120 has twelve pairs of elongated areas 123, 124 defining twelve separate pairs of internal supply and internal ground bars, instead of the four pairs defined by the mask 90 in FIG. 7.

From the above, it is apparent that the programmed VIA layer reduces the design and tooling cost for making a package for a newly designed integrated circuit. Only the programmed VIA layer need be redesigned. Desired variations in the other layers can be provided by selecting a standardized mask set. In a standardized mask set especially adapted for "standard cell" integrated circuit designs only the corner outer lead bonding areas are preassigned to power and ground. In a standardized mask set especially adapted for custom integrated circuit designs, an additional number of outer lead bonding areas are connectable to power and ground through the programmed VIA layer, but they are not connected by signal leads to the external pins.

When a new integrated circuit design is completed, the most appropriate standardized mask set is selected. Next, a mask is designed to program the VIA layer then the masks are used to deposit vias and conductive layers on ceramic layers. The ceramic layers are aligned and integrally bonded together using a conventional co-firing process that is typically used for manufacturing laminated ceramic electrical components. Finally, the integrated circuit chips are assembled into the packages in the conventional fashion; the substrate of the chip is mounted on the internal ground layer, the chip's bonding pads are connected by bonding wire or tape to corresponding outside lead bond areas on the signal layer of the package, and then the package is hermetically sealed by soldering or thermally attaching the cover or lid over the chip cavity.

GLOSSARY

CHIP—a chip of semiconducting material including an integrated circuit.

CO-FIRED CERAMICS—packaging technology which is based on multiple overlaid ceramics layers simultaneously fired to form a monolithic body.

CUSTOM PACKAGE—a package specifically designed for a particular integrated circuit chip.

EXTERNAL SUPPLY—power and ground feeding the input/output, input only and output only drivers on chip.

INPUT SIGNALS—signals which are only received by the chip and never driven by it.

I/O SIGNALS—signals which are both driven and received by the chip.

INTERNAL SUPPLY—power and ground feeding the internal logic of the chip.

OUTER LEAD BOND (OLB)—the locus of all the traces' edges on the inside of the package. The OLB areas are connected by bonding wires to respective pads on the chip.

OUTPUT SIGNALS—signals which are only driven by the chip and are never driven by the environment.

PAD—a relatively large (100 micron square) metallization area placed near the chip's edge to which external wires are bonded.

PIN—a piece of metal coming out of the package. The pins provide mechanical and electrical connections from the package to a printed wiring board or other circuit module.

TRACE—a long metallization geometry which provides an electrical connection between an OLB and a package pin.

VIA—a vertical metallization; conductor which enables an electrical connection between horizontal conductive layers.

We claim:

1. A package for an integrated circuit, said package having a central region containing an integrated circuit chip and external conductive areas for making external connections to said integrated circuit chip, said package comprising a first layer including multiple leads for connecting a multiplicity of said external conductive areas to said integrated circuit, a second layer including bus bars each aligned transversely across said leads and an insulating layer disposed between said first and second layers, said insulating layer including a plurality of programmed vias connecting each of said leads to a selected one of said bus bars, said bus bars supplying power and ground to said integrated circuit chip, wherein a plurality of pairs of said bus bars are disposed in apertures in a planar conductor in said second layer.

2. The package as claimed in claim 1 further comprising third and fourth conductive layers connected by vias to respective ones of said bus bars.

3. The package as claimed in claim 1, wherein said integrated circuit chip is rectangular, said bus bars are parallel to each other, and said bus bars are aligned parallel to an edge of said chip.

4. The package as claimed in claim 3, wherein respective pairs of said bus bars are aligned parallel to each of four edge portions of said chip.

5. The package as claimed in claim 1, wherein said leads have bonding areas connected to said integrated circuit, and said package includes connections to said integrated circuit at bonding areas in said first layer which are not parts of said leads but which are connected by vias to said planar conductor.

6. The package as claimed in claim 1, wherein said planar conductor is connected to input/output stages in said integrated circuit chip for supplying power to said input/output stages, and said bus conductors are connected to internal circuits in said integrated circuit chip for supplying power to said internal circuits.

7. A multi-layer ceramic package encapsulating an integrated circuit, said package having a central cavity containing an integrated circuit chip and external pins connected to said integrated circuit chip, said package comprising alternate conductive and insulating layers, said conductive layers including, in succession, a first layer connected to input/output stages in said integrated circuit chip, a second layer having multiple conductive leads connecting a multiplicity of said external pins to said integrated circuit chip, a third layer connected to said input/output stages in said integrated circuit chip, a fourth layer connected to internal circuits in said integrated circuit chip, and a fifth layer connected to said internal circuits in said integrated circuit chip, said first and third layers being connected for supplying power and ground to said input/output stages, and said fourth and fifth layers being connected for supplying power and ground to said internal circuits, wherein said second and third layers are separated by an insulating layer having disposed in it a plurality of programmed vias connecting selected ones of said leads to said fourth and fifth layers, and wherein said third and fourth layers are separated by an insulating layer having disposed in it a plurality of vias permitting each of said leads to be connected to either said fourth layer or said fifth layer by programming of said programmed vias.

8. The multi-layer ceramic package as claimed in claim 7, wherein said first layer includes an external ground plane, said third layer includes an external supply plane, said fourth layer includes an internal ground plane, and said fifth layer includes an internal supply plane.

9. The multi-layer ceramic package as claimed in claim 7, wherein said third layer includes a planar conductor connected to the input/output stages of said chip, and pairs of bus bars disposed in apertures in said planar conductor and connected to said fourth and fifth layers.

10. The multi-layer ceramic package as claimed in claim 7, wherein said leads have bonding areas connected to said integrated circuit, and said package includes connections to said integrated circuit at bonding areas in said second layer which are not part of said leads but which are connected by vias to said third layer.

11. A multi-layer ceramic package encapsulating an integrated circuit, said package having a central cavity containing an integrated circuit chip and external pins connected to said integrated circuit chip, said package comprising alternate conductive and insulating layers, said conductive layers including, in succession, a first layer connected to input/output stages in said integrated circuit chip, a second layer having multiple conductive leads connecting a multiplicity of said external pins to said integrated circuit chip, a third layer connected to said input/output stages in said integrated circuit chip, a fourth layer connected to internal circuits in said integrated circuit chip, and a fifth layer connected to said internal circuits in said integrated circuit chip, said first and third layers being connected for supplying power and ground to said input/output stages, and said fourth and fifth layers being connected for supplying power and ground to said internal circuits, wherein said second and third layers are separated by an insulating layer having disposed in it a plurality of programmed vias connecting selected ones of said leads to said fourth and fifth layers, said third and fourth layers are separated by an insulating layer having disposed in it a plurality of vias permitting each of said leads to be connected to either said fourth layer or said fifth layer by programming of said programmed vias; said third layer includes a planar conductor connected to the input/output stages of said chip, and pairs of bus bars disposed in apertures in said planar conductor and connected to said fourth and fifth layers; and said leads have bonding areas connected to said integrated circuit, and said package includes connections to said integrated circuit at bonding areas in said second layer which are not part of said leads but which are connected by vias to said third layer.

* * * * *

UNITED STATES PATENT AND TRADEMARK OFFICE
CERTIFICATE OF CORRECTION

PATENT NO. : 4,972,253
DATED : 11-20-90
INVENTOR(S) : Douglas F. Palino, et al

It is certified that error appears in the above-indentified patent and that said Letters Patent is hereby corrected as shown below:

Abstract, line 21    change "lead" to --leads--.

Column 4, line 5, change "here" to --there--.

Column 5, line 54, change "Il" to --11--.

Column 9, line 3, after "leads" insert --,--.

Signed and Sealed this

Twenty-second Day of March, 1994

*Attest:*

BRUCE LEHMAN

*Attesting Officer*     Commissioner of Patents and Trademarks